United States Patent
Ishibashi (10) Patent No.: US 6,858,893 B2
(45) Date of Patent: Feb. 22, 2005

(54) SEMICONDUCTOR MEMORY HAVING A PILLAR TYPE TRENCH DRAM CELL

(75) Inventor: Shigeru Ishibashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 10/316,148

(22) Filed: Dec. 10, 2002

(65) Prior Publication Data

US 2003/0151068 A1 Aug. 14, 2003

(30) Foreign Application Priority Data

Dec. 11, 2001 (JP) ........................................ 2001-377405

(51) Int. Cl.[7] ....................... H01L 27/108; H01L 29/76; H01L 29/94; H01L 31/119
(52) U.S. Cl. ....................................... 257/302; 438/242
(58) Field of Search .......................... 257/302; 438/242

(56) References Cited

U.S. PATENT DOCUMENTS

| | | | | |
|---|---|---|---|---|
| 4,990,980 A | * | 2/1991 | Wada ......................... | 257/302 |
| 5,177,576 A | * | 1/1993 | Kimura et al. ............... | 257/71 |
| 5,949,700 A | | 9/1999 | Furukawa et al. | |
| 6,034,389 A | | 3/2000 | Burns, Jr. et al. | |
| 6,262,894 B1 | * | 7/2001 | Nelson et al. .............. | 361/727 |

FOREIGN PATENT DOCUMENTS

| | | |
|---|---|---|
| JP | 02-237061 | 9/1990 |
| JP | 02-309671 | 12/1990 |
| JP | 05-029572 | 2/1993 |
| JP | 07-058218 | 3/1995 |
| JP | 07-130871 | 5/1995 |
| JP | 11-289071 | 10/1999 |

OTHER PUBLICATIONS

Bryant, A., et al. "Characteristics of CMOS Device Isolation for the ULSI Age", Dec. 1994, IEDM, pp. 671–674.*

* cited by examiner

*Primary Examiner*—Howard Weiss
(74) *Attorney, Agent, or Firm*—Hogan & Hartson, LLP (57) ABSTRACT

A semiconductor memory includes a silicon substrate having a cell array region wherein plural rectangular silicon pillars are formed in rows and columns by a trench having a width of 1$a$ and formed in a lattice form, a storage node formed on at least a surface of a lower portion of the silicon pillar, a well region formed in an upper half above the storage node, a diffusion layer formed on an upper surface of the well region, a capacitor dielectric formed on the storage node to surround the lower portion of the silicon pillar, a plate electrode buried in the lower portion of the trench to substantially the same level as the upper end of the storage node, and a first gate electrode formed on the channel portion via a first gate insulator.

9 Claims, 10 Drawing Sheets

SEMICONDUCTOR MEMORY HAVING A PILLAR TYPE TRENCH DRAM CELL

CROSS-REFERENCE TO RELATED APPLICATIONS

This application is based upon and claims the benefit of priority from the prior Japanese Patent Application No. 2001-377405, filed Dec. 11, 2001, the entire contents of which are incorporated herein by reference.

BACKGROUND OF THE INVENTION

1. Field of the Invention

The present invention relates to a semiconductor memory and, more particularly, to a pillar type trench DRAM cell using a vertical MIS (Metal Insulator Semiconductor) as a transfer gate and the structure of a cell array of this DRAM cell.

2. Description of the Related Art

As the design rule decreases, the gate length of a MOS transistor (cell transistor) as a transfer gate of a DRAM cell must be decreased by the same length as the minimum design rule. Even when the gate length is thus decreased, the threshold value of the cell transistor must be held substantially constant when a leakage current while this transistor is OFF is taken into consideration.

To hold the threshold voltage of the cell transistor constant, the impurity concentration in a channel portion of the cell transistor must be increased by taking the short channel effect into account. However, increasing the impurity concentration in this channel portion increases the junction leakage current or deteriorates the pause characteristic.

As a countermeasure against this inconvenience, there is a method by which a cell transistor is changed from a conventional planar MOS transistor to a vertical MOS transistor, thereby releasing the gate length of this cell transistor from the limitations of a planar minimum design rule.

An example of the vertical transistor is "A Surrounding Gate Transistor (SGT) Cell for 64/256M bit DRAM" described in International Electron Device Meeting (IEDM) 1989 Technical Digest, pp. 23 to 26.

Unfortunately, in the structure of this conventional vertical transistor, a gate electrode is so formed as to surround the circumferential surface of a silicon pillar. This makes it difficult to reduce the pattern area when a DRAM cell array is designed. In addition, when the DRAM cell array is formed, alignment with peripheral transistors, which are transistors in a peripheral circuit, is difficult to obtain. So, it is difficult to simultaneously form the DRAM cell array and peripheral transistors.

Accordingly, it is being desired to realize a semiconductor memory by which the pattern area of a cell array of a pillar type trench DRAM cell using a vertical MOS transistor as a transfer gate is easily reduced, alignment with peripheral transistors is readily obtainable when this DRAM cell array is formed, and these DRAM cell array and peripheral transistors can be easily formed at the same time while an increase in the number of masks is minimized.

BRIEF SUMMARY OF THE INVENTION

A semiconductor memory according to the first aspect of the present invention comprises a first-conductivity-type silicon substrate having a cell array region in which a plurality of rectangular silicon pillars are formed in rows and columns by a trench having a width of $1a$ and formed in a form of a lattice, lengths of adjacent sides of each silicon pillar being $1a$ and $1b$, a storage node formed of a second-conductivity-type semiconductor layer on at least a surface of a lower portion of each of the plurality of silicon pillars, a first-conductivity-type well region formed in an upper half above the storage node of each of the plurality of silicon pillars, a portion of the well region present on one side surface of each of the silicon pillars functioning as a channel portion of a vertical MIS transistor, a second-conductivity-type diffusion layer formed on an upper surface of the well region, a capacitor insulating film formed on the storage node so as to surround the lower portion of each of the plurality of silicon pillars, a plate electrode buried in a lower portion of the trench to substantially the same level as an upper end of the storage node, a first gate insulating film of the vertical MIS transistor formed on a surface of the channel portion, and a first gate electrode formed on the first gate insulating film so as to oppose the channel portion.

A semiconductor memory according to the second aspect of the present invention comprises a first-conductivity-type silicon substrate having a cell array region in which a plurality of rectangular silicon pillars are formed in rows and columns by a trench having a width of $1a$ and formed in a form of a lattice, lengths of adjacent sides of each of the silicon pillars being $1a$ and $1b$, a storage node formed of a second-conductivity-type semiconductor layer on at least a surface of a lower portion of each of the plurality of silicon pillars, a first-conductivity-type well region formed in an upper half above the storage node of each of the plurality of silicon pillars, a portion of the well region present on one side surface of each of the silicon pillars functioning as a channel portion of a vertical MIS transistor, a second-conductivity-type diffusion layer formed on an upper surface of the well region, a capacitor insulating film formed on the storage node so as to surround the lower portion of each of the plurality of silicon pillars, a plate electrode buried in a lower portion of the trench to substantially the same level as an upper end of the storage node, a first gate insulating film of the vertical MIS transistor formed on a surface of the channel portion, and a first gate electrode formed of a metal on the first gate insulating film so as to oppose the channel portion.

DETAILED DESCRIPTION OF THE INVENTION

Embodiments of the present invention will be described in detail below with reference to the accompanying drawing.

<First Embodiment>

Figure 1A:
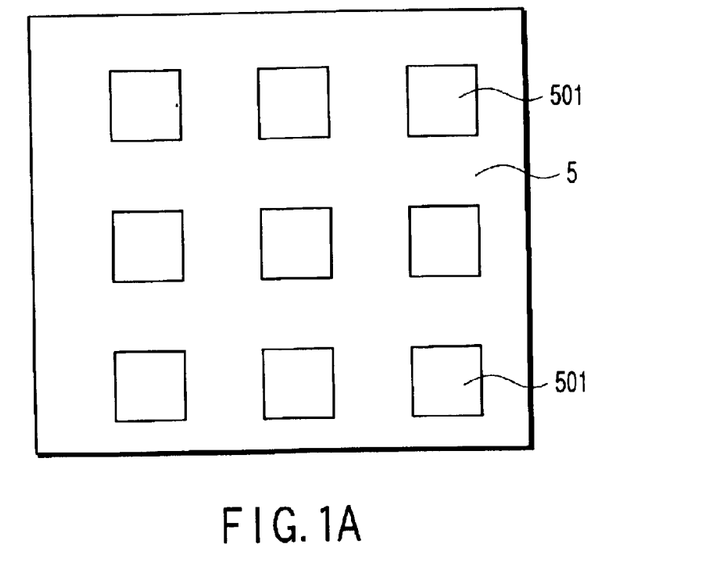
FIG. 1A is a plan view on the plate electrode level showing the array of silicon pillars in a semiconductor memory according to the first embodiment of the present invention.

A semiconductor memory according to the first embodiment of the present invention has a pillar type trench DRAM cell using a vertical MIS (Metal Insulator Semiconductor) transistor as a transfer gate. FIG. 1A shows the planar pattern on the plate electrode level of the lower structure of a portion of a cell array.

Figure 1B:
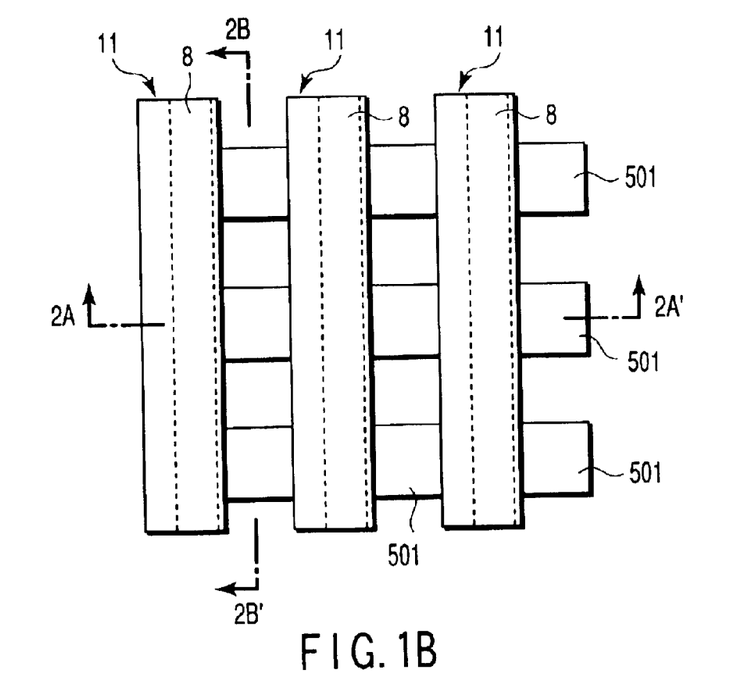
FIG. 1B is a plan view on the gate electrode level of the semiconductor memory of the first embodiment.
Figure 2A:
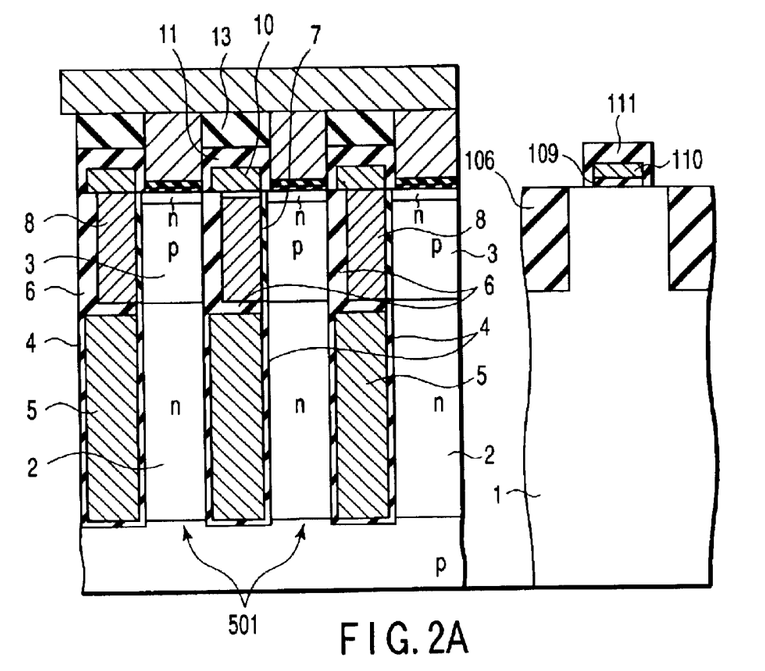
FIG. 2A is a sectional view taken along a line 2A—2A in FIG. 1B.
Figure 2B:
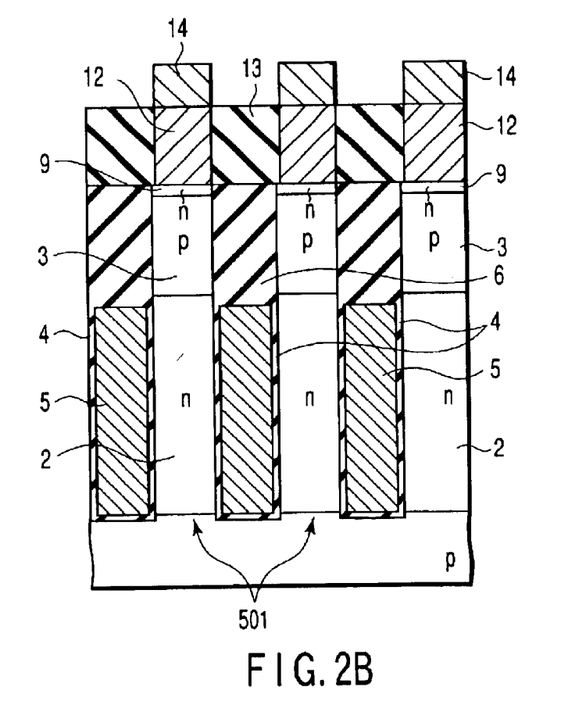
FIG. 2B is a sectional view taken along a line 2B—2B in FIG. 1B.

FIG. 1B shows the planar pattern on the gate electrode level of the upper structure of the cell array shown in FIG. 1A. FIG. 2A shows a sectional structure taken along a line 2A—2A in FIG. 1B. FIG. 2B shows a sectional structure taken along a line 2B—2B in FIG. 1B.

Referring to FIGS. 1A and 1B and FIGS. 2A and 2B, in a DRAM cell array region, deep trenches having a width of 1 F (F is a fixed value of the minimum processing dimension) are formed into the form of a lattice in, e.g., a p-type silicon substrate 1. With these trenches, silicon pillars 501 having a square planar shape of 1 F side are formed into rows and columns in this cell array region.

In the lower portion of each silicon pillar 501, a storage node 2 having a conductivity type (in this embodiment, n-type) different from the silicon substrate 1 is formed. In the upper portion of each silicon pillar 501, a well region 3 having the same conductivity type (in this embodiment, p-type) as the silicon substrate 1 is formed. On the upper surface of this well region 3, a diffusion layer 9 (drain region) having the conductivity type (in this embodiment, n-type) different from the silicon substrate 1 is formed. One side surface of this well region 3 is used as a channel portion of the vertical MIS transistor. Also, the storage node 2 is used as a source region of the vertical MIS transistor.

In the trenches around the storage nodes 2 in the lower portions of the silicon pillars 501, plate electrodes 5 are buried in the form of a square lattice via a capacitor insulating film 4. The upper portions (above the storage nodes) of these plate electrodes 5 are etched away after the plate electrodes 5 are buried in the trenches between the silicon pillars 501. At the same time, shallow trenches are formed in a peripheral region of the silicon substrate 1 by this etching. An insulator 106 is buried in these trenches to form element isolation regions having a shallow trench isolation (STI) structure.

In that portion of each trench, which corresponds to the upper portion of the silicon pillar 501, an on-plate collar insulating film 6 is formed on the plate electrodes 5. As shown in FIG. 2A, a trench is formed in this on-plate collar insulating film 6.

On the surface of the channel portion as one side surface of the well region 3, a first gate electrode 8 using, e.g., polysilicon is buried via a gate insulating film 7 in the trench formed in the on-plate collar insulating film 6.

Referring to FIG. 2A, the film thickness of that portion of the on-plate collar insulating film 6, which faces the channel portion of the adjacent silicon pillar 501, is larger than that of the gate insulating film 7. Referring to FIG. 2B, this on-plate collar insulating film 6 forms STI structure element isolation regions 6 formed between the upper portions of the silicon pillars 501. Also, the first gate electrodes 8 are linearly formed in a first direction (row direction) along the side surfaces of a plurality of silicon pillars 501 in the same row.

In the peripheral region, a gate insulating film 109 is formed on the surface of a channel portion of a peripheral transistor. On the first gate electrode 8 of the DRAM cell and on the gate insulating film 109 of the peripheral transistor, a second gate electrode 10 of the DRAM cell and a gate electrode 110 of the peripheral transistor, respectively, are formed at the same time. The second gate electrode 10 is made of a metal such as tungsten and has a resistance lower than that of the first gate electrode 8 made of polysilicon.

In addition, a cap/sidewall insulating film 11 covering the surface of the second gate electrode 10 of the DRAM cell and a cap/sidewall insulating film 111 covering the surface of the gate electrode 110 of the peripheral transistor are simultaneously formed.

Furthermore, a dielectric interlayer (second gate insulating film) 13 is formed on the entire surface of the cell array region. In this dielectric interlayer 13, bit line contact holes are formed in self-alignment with the cap/sidewall insulating film 11. After contact plugs 12 are buried in these bit line contact holes, bit lines 14 are formed.

Note that at the same time bit line contact holes are formed, plate electrode extracting substrate contacts (not shown) are formed in the peripheral portion of the cell array region. Plate lines are connected via these substrate contacts.

Similar to "A Surrounding Gate Transistor (SGT) Cell for 64/256M bit DRAM" of the aforementioned prior art, this pillar type trench DRAM cell with the above structure uses the trench capacitor and the vertical transistor formed in the silicon pillar 501 as the transfer gate.

This makes it possible to release the gate length of the cell transistor from the planar design rule restrictions. So, the gate length in the vertical direction of the vertical transistor can be made larger than the minimum line width F on the design rules. This prevents a decrease in the threshold value of the cell transistor caused by the short channel effect. Accordingly, the impurity concentration in the channel portion need not be increased, and deterioration of the pause characteristic of the DRAM can be prevented. Also, the simple structure simplifies the fabrication process.

Additionally, in the DRAM cell array of this embodiment, the square silicon pillars 501 of 1 F side and the DRAM cells formed around them are arranged into rows and columns at intervals of substantially 1 F (2 F pitch). Only one side surface of the well region 3 in the upper portion of each silicon pillar 501 functions as a channel portion, and the gate electrode 8 is formed on the surface of this channel portion via the gate insulating film 7. This gate electrode 8 is linearly formed in the row direction along the side surfaces of the silicon pillars 501 in the same row.

This makes a layout by a pattern area of 4 $F^2$ (=2 F×2 F) per cell possible and can thereby reduce the cell array design rules. Therefore, the pattern area can be reduced more easily than in the structure of "A Surrounding GATe Transistor (SGT) Cell for 64/256M bit DRAM" of the prior art in which gate electrodes are formed around silicon pillars.

Also, in the DRAM cell array of this embodiment, the second gate electrode 10 of the cell transistor and the gate electrode 110 of the peripheral transistor can be simultaneously formed. This simplifies the fabrication steps. The performance can be improved by using a high-dielectric gate insulating film or metal gate as the peripheral transistor.

The formation steps of the pillar type trench DRAM cell array and its peripheral transistor described above will be explained below with reference to FIGS. 3 to 9.

Figure 3:
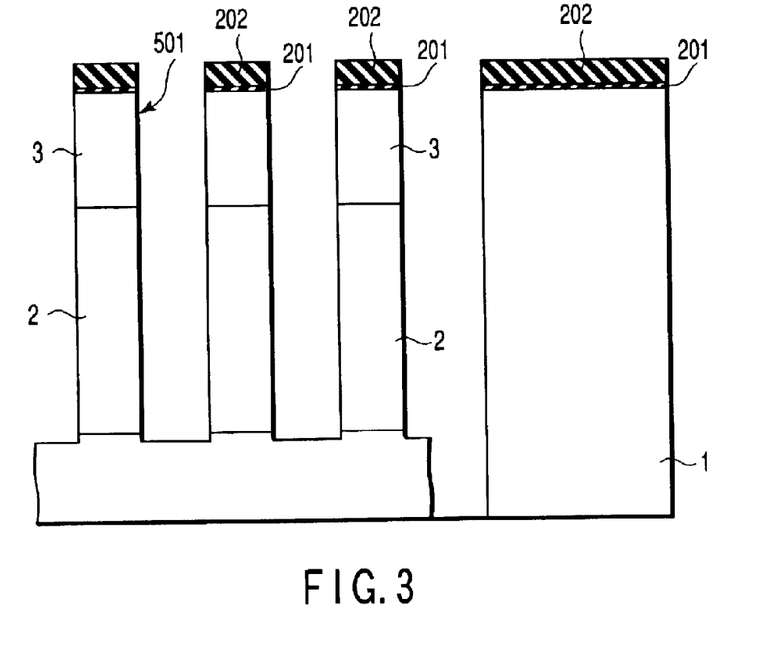
FIGS. 3 to 9 are sectional views showing the steps of forming the semiconductor memory of the first embodiment step by step.

First, as shown in FIG. 3, a pad oxide film 201 is formed on a p-type silicon substrate 1, and a pad nitride film 202 is deposited on this pad oxide film 201. Storage node portions 2 (n-type) of capacitors and well regions 3 (n-type) for forming cell transistors are formed by ion implantation or the like.

Subsequently, a resist (not shown) is formed by coating and patterned to form square silicon pillars 501 of 1 F side in a cell array region as shown in FIG. 1A. This resist pattern is used as a mask to process the pad nitride film 202. The processed pad nitride film 202 is then used as a mask to etch the silicon substrate 1, thereby leaving the silicon pillars 501 (pillar formation). After that, the resist (not shown) is removed.

Figure 4:
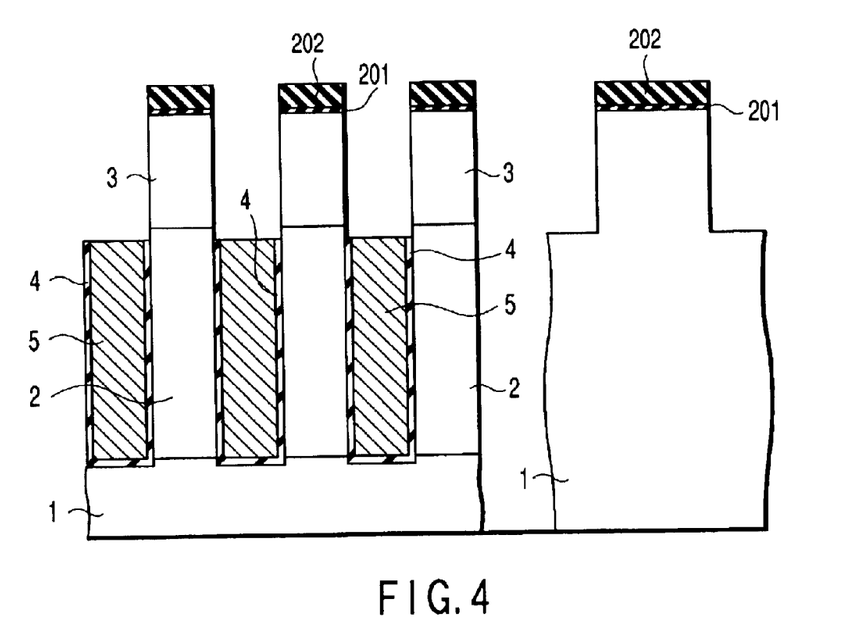

As shown in FIG. 4, a capacitor insulating film 4 is formed on the surfaces of the silicon pillars 501 by using an oxynitride film or the like. Polysilicon for forming plate electrodes 5 is so deposited as to fill trenches between the silicon pillars 501. After that, the upper surface is planarized by CMP or the like by using the pad nitride film 202 as a stopper.

Next, a resist (not shown) is again formed by coating and patterned in a peripheral region while the cell array region is covered with this resist. The patterned resist is used as a mask to process the pad nitride film 202 in the peripheral region. After that, the resist (not shown) is removed.

The pad nitride film 202 in the peripheral region is then used as a mask to form shallow STI formation trenches in the silicon substrate 1. Simultaneously, shallow trenches are formed in the plate electrode formation polysilicon in the cell array region to leave plate electrodes 5. The process can be shortened because the peripheral transistor STI structures and trenches are formed at the same time the polysilicon is etched as described above.

Furthermore, the plate electrodes 5 are used as masks to remove the capacitor insulating film 4 above these plate electrodes 5.

Figure 5:
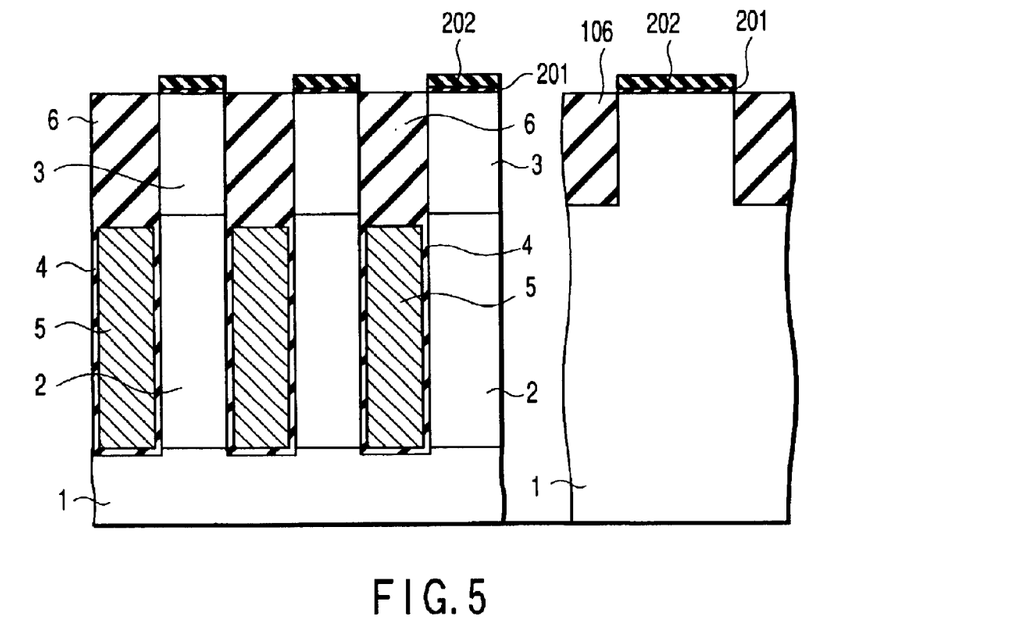

As shown in FIG. 5, a nitride film is so deposited as to fill the trenches on the plate electrodes 5 in the cell array region and the STI formation trenches in the peripheral region. The pad oxide film 202 is used as a stopper to planarize the upper surface by CMP or the like, thereby forming an on-plate electrode collar insulating film 6 and STI structures 106 at the same time. Note that the nitride film remaining in portions surrounded by the pad nitride film 202 and pad oxide film 201 after the planarization is removed by, e.g., wet etching.

Figure 6:
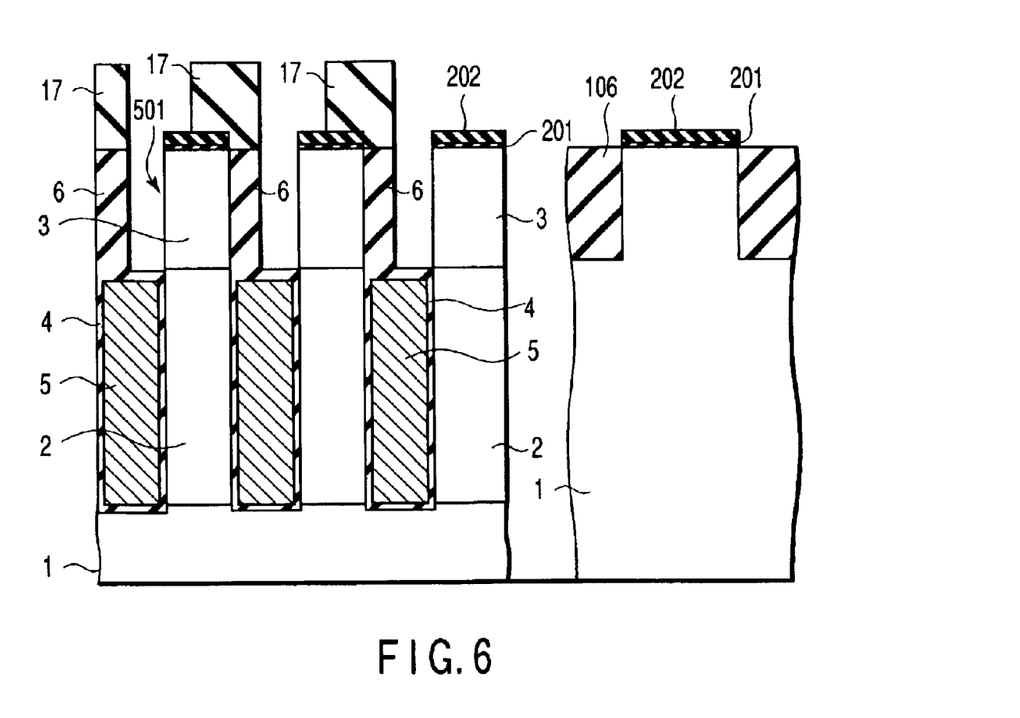

As shown in FIG. 6, a resist 17 having a predetermined pattern is formed on the cell array region. This resist 17 is used as a mask to pattern the on-plate collar insulating film 6 by adjusting the etching amount such that this on-plate collar insulating film 6 partially remains on the plate electrodes 5.

During this etching, alignment of the resist 17 to the silicon pillars 501 is so set that the on-plate collar insulating film 6 is completely removed from one side surface of the pillar 501 as a channel portion of each well region 3, and that this on-plate collar insulating film 6 partially remains with a thickness larger than that of a gate insulating film 7 (to be described later) on the side of the pillar 501 away from the side as a channel portion of the well region 3.

Figure 7:
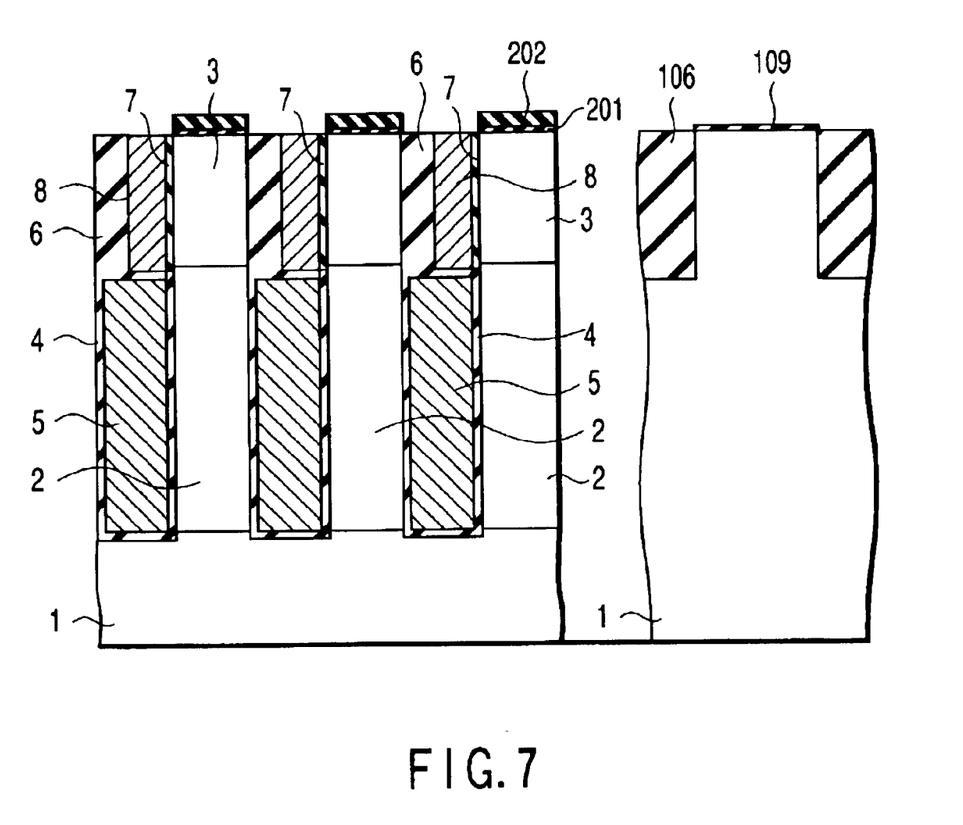

As shown in FIG. 7, an oxide film, for example, is formed as a gate insulating film 7 of a cell transistor on the side surface as a channel portion of each well region 3. Subsequently, phosphorus-doped polysilicon or the like is deposited, and the upper surface is planarized by CMP or the like, thereby forming first gate electrodes 8 of cell transistors such that these first gate electrodes 8 oppose the channel portions via the gate insulating films 7.

Each gate electrode 8 is linearly buried in the on-plate collar insulating film 6 in a first direction (row direction) along the side surfaces of the silicon pillars 501 in the same row.

Next, the cell array region is masked with a resist (not shown), and ion implantation is performed to form a well and a channel portion in the peripheral region. After that, the resist is used as a mask to remove the pad nitride film 202 and pad oxide film 201. After the resist is removed, an oxide film, for example, is formed as a gate insulating film 109 of a MIS transistor on the surface of a channel portion in the peripheral region. As this gate insulating film 109 of the peripheral transistor, a high-dielectric film of an oxide of, e.g., tantalum or hafnium can be used. This can improve the performance of the peripheral transistor.

Figure 8:
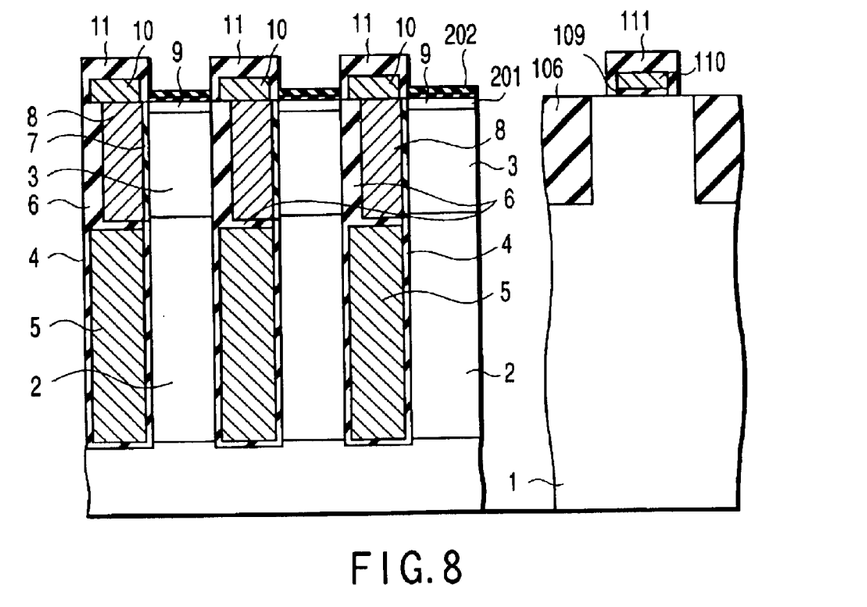

As shown in FIG. 8, the peripheral region is masked with a resist (not shown), and an n-type diffusion layer 9 serving as the drains of cell transistors is formed on the upper surfaces of the well regions 3 by ion plantation of, e.g., phosphorus. The resist is used as a mask to remove the peripheral transistor gate insulating film 109 which is also formed on the first gate electrodes 8 of the cell transistors.

To simultaneously form second gate electrodes 10 and a gate electrode 110 of the peripheral transistor, a metal such as tungsten or silicide such as tungsten silicide is deposited on the entire wafer surface and patterned.

Even if misalignment occurs between the pattern of the second gate electrodes 10 and the silicon pillars 501, the pad nitride film 202 and pad oxide film 201 function as barriers which separate the second gate electrodes 10 from the n-type diffusion layer 9.

Also, to simultaneously form a cap/sidewall insulating film 11 covering the surfaces of the second gate electrodes 10 and a cap/sidewall insulating film 111 covering the surface of the gate electrode 110, a thin nitride film is deposited on the entire surface and etched by reactive ion etching (RIE). In addition, an n-type diffusion layer (not shown) serving as the drain and source of the peripheral transistor is formed by ion implantation of, e.g., phosphorus.

Figure 9:
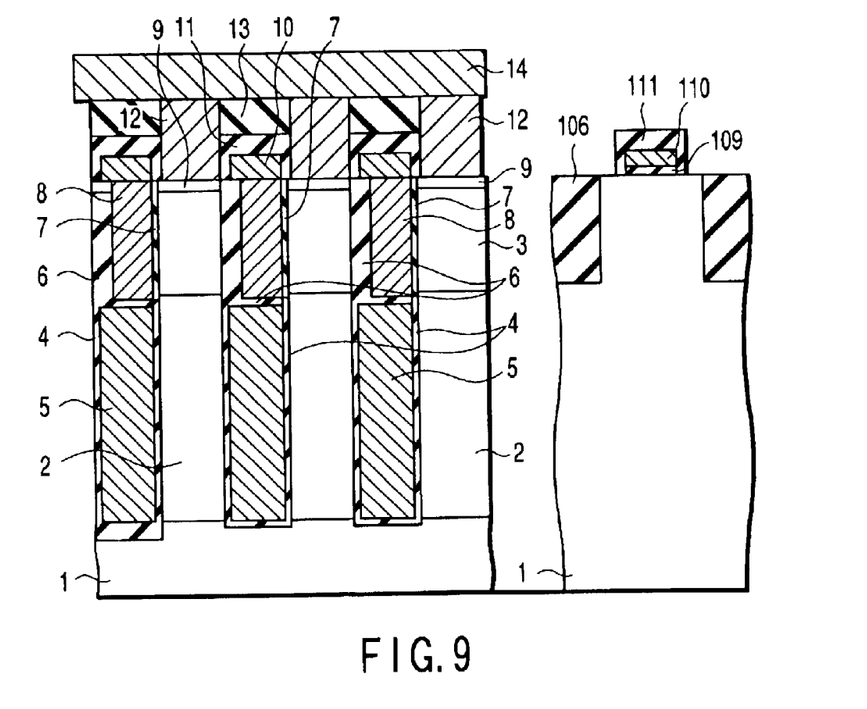

Finally, as shown in FIG. 9, a dielectric interlayer 13 is deposited on the entire surface of the cell array region and planarized. After that, a resist (not shown) is formed, and bit line contact holes which expose the diffusion layer 9 are formed. These bit line contact holes are formed in self-alignment with the cap/sidewall insulating film 11 which cover the surfaces of the second gate electrodes 10 of the cell transistors, and expose the diffusion layer 9. A conductive material is buried in these contact holes to form contact plugs 12. Furthermore, a metal wiring layer is formed on the dielectric interlayer 13 so as to connect to the contact plugs 12, and bit lines 14 are formed by patterning.

In the above embodiment, a DRAM cell array is formed on a p-type substrate. However, this DRAM cell array can also be formed on an n-type substrate. In this case, the silicon substrate 1 is n-type, the storage node 2 is p-type, the well region 3 is n-type, and the diffusion layer 9 is p-type.

<Second Embodiment>

Figure 10:
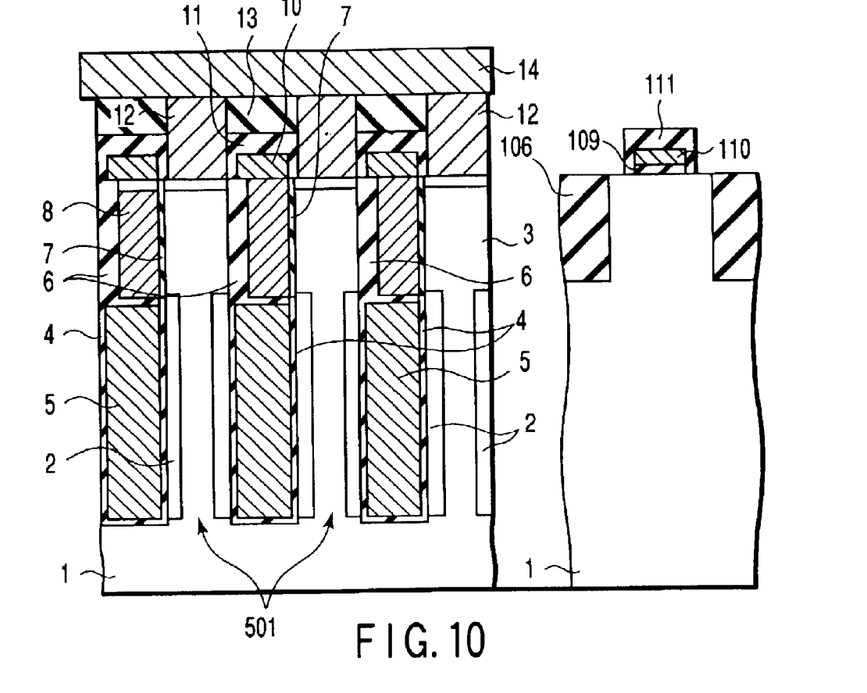
FIG. 10 is a sectional view of a semiconductor memory according to the second embodiment of the present invention.

FIG. 10 is a sectional view of a semiconductor memory according to the second embodiment of the present invention. That is, FIG. 10 shows the sectional structure of a portion of a pillar type trench DRAM cell array using vertical MIS transistors as transfer gates.

These DRAM cell and cell array are the same as the DRAM cell and cell array according to the first embodiment except that storage nodes 2 of capacitors are formed on the outer side surfaces of the lower portions of silicon pillars 501 by, e.g., diffusion of arsenic from the lower side surfaces of these silicon pillars 501, and that the central portion of the lower portion of each silicon pillar 501 is held at the same conductivity type (in this embodiment, p-type) as that of a well region 3 of a cell transistor. Therefore, the same reference numerals as in FIG. 2A denote the same parts in FIG. 10.

With this structure, the well region 3 can be prevented from potentially floating. Accordingly, the threshold value of the vertical MIS transistor is not influenced by the potential of an adjacent cell any longer, and this makes the OFF current stable.

The formation steps of the DRAM cell array and its peripheral transistor according to the second embodiment will be explained below with reference to FIG. 11.

Figure 11:
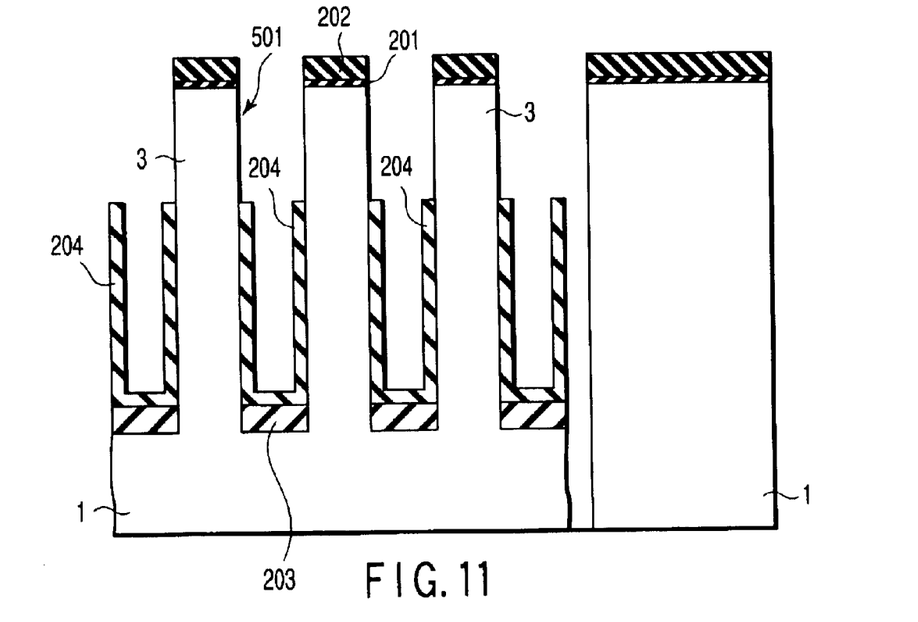
FIG. 11 is a view for explaining a method of forming the semiconductor memory of the second embodiment.

First, as shown in FIG. 11, a pad oxide film 201 is formed on a p-type silicon substrate 1, and a pad nitride film 202 is deposited on this pad oxide film 201. Well regions 3 (n-type) for forming cell transistors are formed by ion implantation or the like.

Next, a resist (not shown) is formed by coating and patterned to form square silicon pillars 501 of 1 F side in a cell array region. This resist pattern is used as a mask to process the pad nitride film 202. In addition, the processed pad nitride film 202 is used as a mask to etch the silicon substrate 1 so as to leave the silicon pillars 501. After that, the resist (not shown) is removed.

Subsequently, an insulating film 203 such as SOG (Spin On Glass) is buried in trenches between the silicon pillars 501 and planarized. The upper portion of this insulating film 203 is etched to leave the insulating film 203 for separating adjacent transistors only in the bottom portions of the trenches between the silicon pillars 501. Thin AsSG (As doped Silicate Glass) is deposited on the entire surface, a resist (not shown) is formed by coating, and this resist is removed from the upper half of each silicon pillar 501. The remaining resist is used as a mask to etch the AsSG to leave AsSG 204 only on the sidewalls of the lower portions of the silicon pillars 501.

After that, As is diffused into the silicon pillars 501 from the lower sidewalls of these silicon pillars 501 by annealing. By appropriately adjusting this annealing step, As is doped only into the surfaces of these silicon pillars 501, thereby forming n-type storage nodes 2 (shown in FIG. 10).

The AsSG 204 is then removed, and the subsequent steps are performed in the same manner as for the steps from FIG. 4 in the first embodiment described previously.

<Third Embodiment>

Figure 12A:
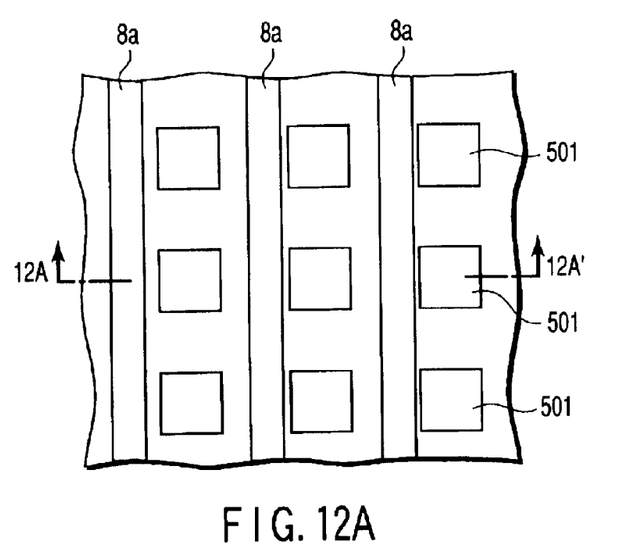
FIG. 12A is a plan view on the gate electrode level of a semiconductor memory according to the third embodiment of the present invention.

FIG. 12A is a plan view of a semiconductor memory according to the third embodiment of the present invention. That is, FIG. 12A shows the planar pattern on the gate electrode level of a portion of a pillar type trench DRAM cell array using vertical MIS transistors as transfer gates.

Figure 12B:
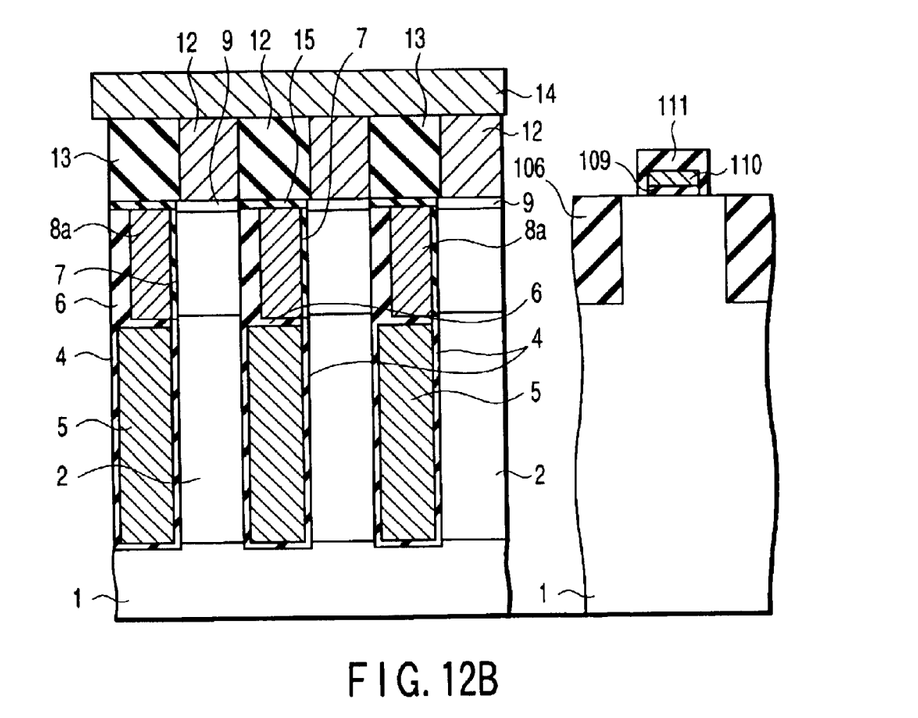
FIG. 12B is a sectional view taken along a line 12B—12B in FIG. 12A.

FIG. 12B shows the sectional structure of the DRAM cell taken along a line 12B—12B in FIG. 12A.

These DRAM cell and cell array are different from the DRAM cell and cell array according to the first or second embodiment in that (1) a low-resistance first gate electrode 8a of a cell transistor is formed using a metal such as tungsten, and a second gate electrode 10 is omitted, and (2) a cap insulating film 15 is formed on an on-plate collar insulating film 6 and on the upper surface of the first gate electrode 8a in order to prevent a short circuit between a bit line contact plug 12 and the first gate electrode 8a when pattern misalignment occurs during the formation of the bit line contact plug 12. Since the rest is the same as FIGS. 1B and 2A, the same reference numerals denote the same parts in FIGS. 12A and 12B.

In this structure using the low-resistance first gate electrode 8a, this first gate electrode 8a of the cell transistor is covered with the cap insulating film 15 when a gate insulating film 109 of a peripheral transistor is formed in a subsequent step. Since this eliminates the step of removing the gate insulating film 109 of the peripheral transistor from the upper surface of the first gate electrode 8a of the cell transistor after that, the fabrication process is simplified.

Also, a low-resistance metal material is used as the gate electrode 8a, so the second gate electrode 10 of the cell transistor is unnecessary. Therefore, no capacitance exists between the bit line contact plug 12 and the second gate electrode 10 of the cell transistor any longer. This reduces the bit line capacitance.

Figure 13:
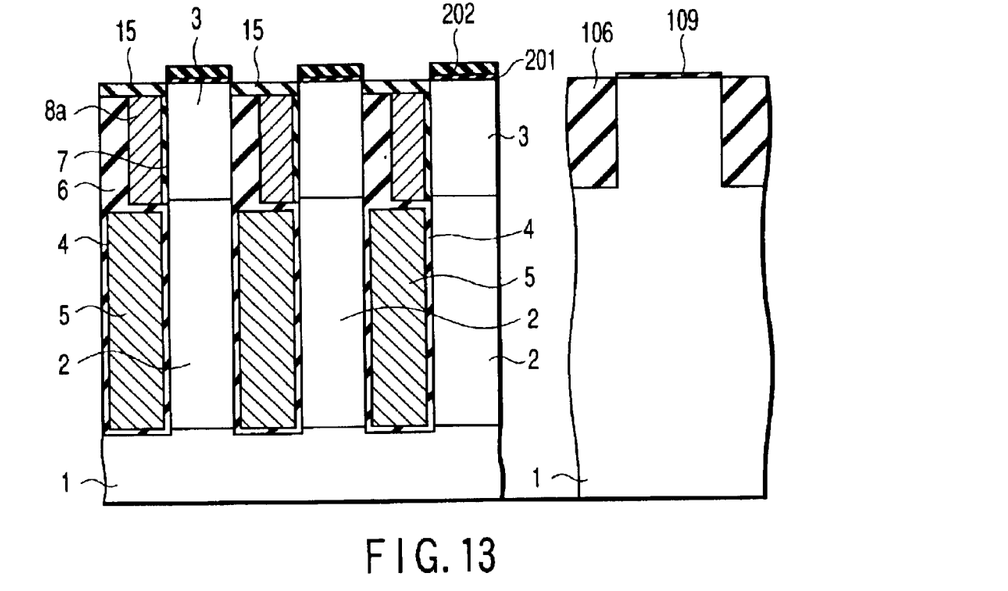
FIG. 13 is a sectional view for explaining a method of forming the semiconductor memory of the third embodiment.

The formation steps of the DRAM cell array and its peripheral transistor according to the third embodiment will be explained below with reference to FIG. 13.

Before first gate electrodes 8a of cell transistors are formed by a metal such as tungsten, the same steps as in the first or second embodiment described above are performed. To form first gate electrodes 8a, a metal such as tungsten is deposited and planarized by CMP or the like. The upper portions of these first gate electrodes 8a are slightly etched to form recesses shallower than a diffusion layer 9. An insulating film 15 such as an oxide film is deposited on these recesses and planarized by CMP or the like.

The above steps are performed in the same manner as in the first or second embodiment (except for the steps of forming a second gate electrode 10 and a cap/sidewall insulating film 11 covering the surface of the second gate electrode 10).

Figure 14:
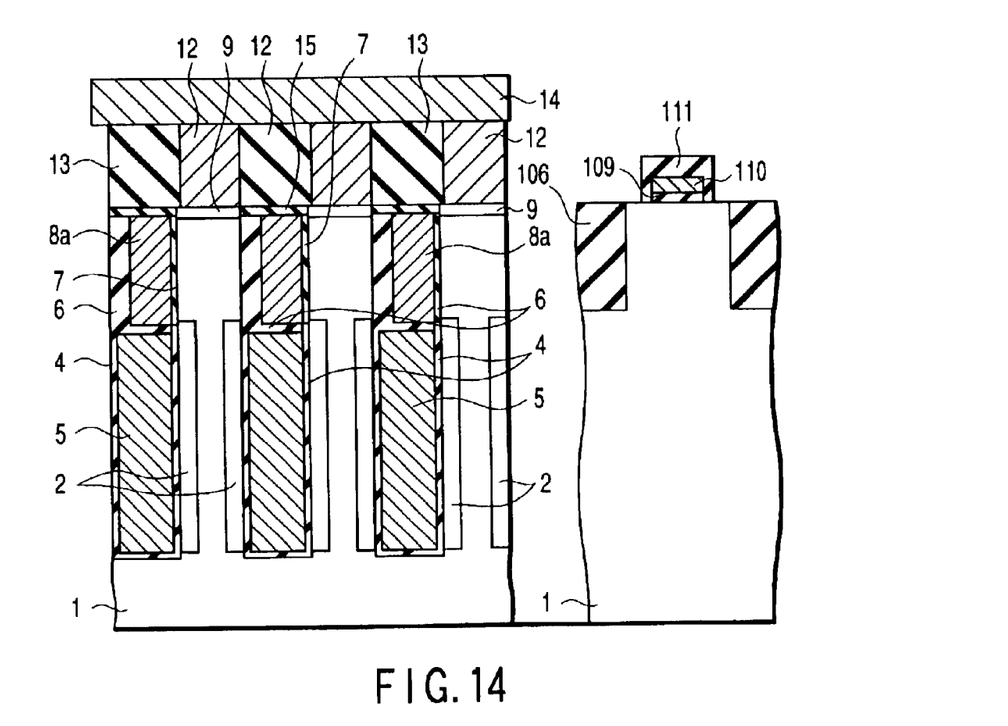
FIG. 14 is a sectional view showing a modification of the third embodiment.

In this third embodiment, storage nodes are the same as in the first embodiment. However, as shown in FIG. 14, these storage nodes can also be the same as in the second embodiment.

<Fourth Embodiment>

Figure 15A:
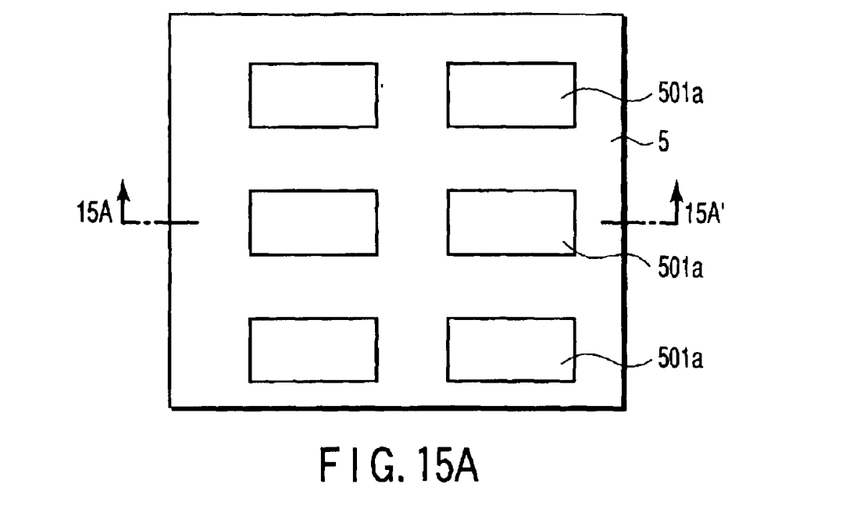
FIG. 15A is a plan view on the plate electrode level showing the array of silicon pillars in a semiconductor memory according to the fourth embodiment.

FIG. 15A is a plan view of a semiconductor memory according to the fourth embodiment of the present invention. That is, FIG. 15A shows the planar pattern on the plate electrode level of a portion of a pillar type trench DRAM cell array using vertical MIS transistors as transfer gates.

Figure 15B:
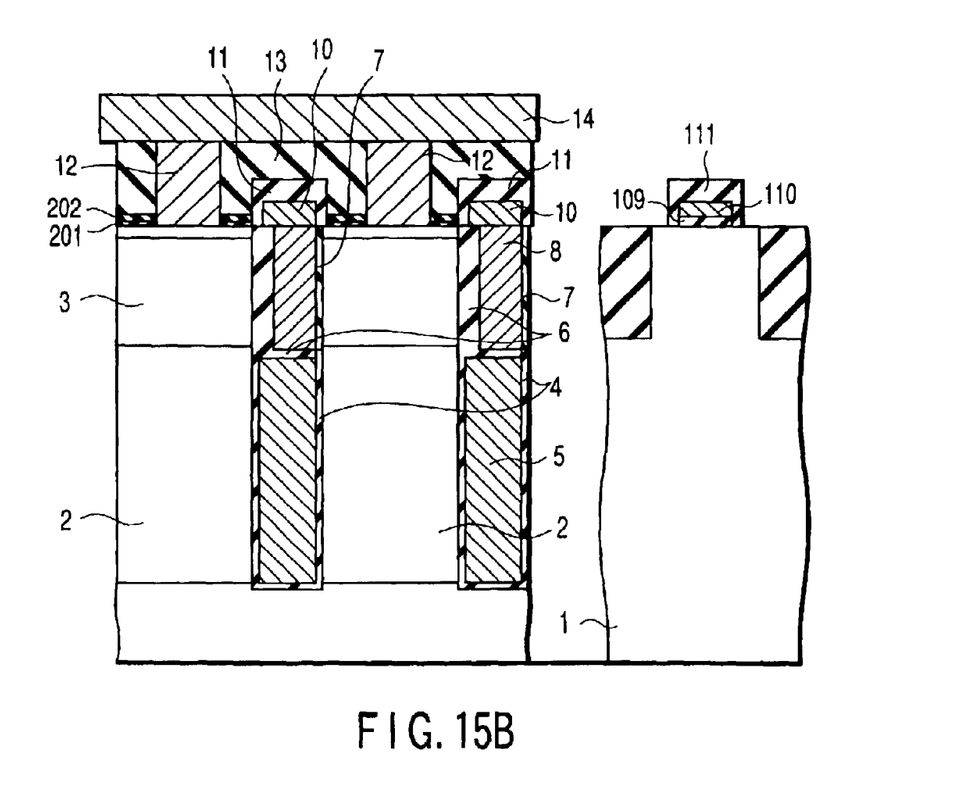
FIG. 15B is a sectional view of the semiconductor memory of the fourth embodiment taken along a line 15B—15B in FIG. 15A.

FIG. 15B shows the sectional structures of the DRAM cell and a peripheral transistor taken along a line 15B—15B in FIG. 15A.

These DRAM cell and cell array are the same as the DRAM cells and cell arrays according to the first to third embodiments except that each side in a bit line direction of each silicon pillar 501*a* are made longer than 1 F. Therefore, the same reference numerals as in FIGS. 1A and 2A denote the same parts in FIGS. 15A and 15B.

This silicon pillar 501*a* having a rectangular planar shape in which the length of a short side is 1 F and the length of a long side is larger than 1 F has a peripheral length (the length of one side of a capacitor insulating film) larger than that of the silicon pillar 501 of the first embodiment. This can increase the capacitance of the trench capacitor.

The formation steps of the DRAM cell array and its peripheral transistor according to the fourth embodiment are basically the same as the steps in the first to third embodiments except that each side in a bit line direction of the silicon pillar 501*a* is made longer.

In the semiconductor memory and its fabrication method of the present invention as described above, a vertical MIS transistor as a transfer gate is formed around a square silicon pillar of 1 F side or around a rectangular silicon pillar whose short side is 1 F and long side is longer than 1 F, and each DRAM cell is formed using this vertical MIS transistor and a trench capacitor. An array is realized by laying out these DRAM cells into rows and columns with a pattern area which is 4 $F^2$ or more per cell. Consequently, the cell array design rules can be relaxed.

In addition, only one side surface of a well region in the upper portion of the silicon pillar functions as a channel portion, and a gate electrode is formed on the surface of this channel portion via a gate insulating film. This gate electrode is linearly formed in the row direction along the side surfaces of silicon pillars in the same row. Accordingly, the pattern area can be readily reduced.

Also, the DRAM cells and peripheral transistor can be formed as they are well aligned without adding any extra steps. The performance of the peripheral transistor can be effectively improved by using a high-dielectric insulating film or metal gate as this transistor.

In each of the above embodiments, a silicon oxide film is used as the gate oxide film of the vertical MIS transistor. However, it is also possible to use a silicon nitride film or high-dielectric insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a first-conductivity-type silicon substrate having a cell array region in which a plurality of rectangular silicon pillars are formed in rows and columns by a trench having a width of 1*a* and formed in a form of a lattice, lengths of adjacent sides of each of the silicon pillars being 1*a* and 1*b*, with adjacent sides of the silicon pillars in a same row being aligned in a line and adjacent sides of the silicon pillars in a same column being aligned in a line;
   a storage node formed of a second-conductivity-type semiconductor layer on at least a surface of a lower portion of each of the plurality of silicon pillars;
   a first-conductivity-type well region formed in an upper half above the storage node of each of the plurality of silicon pillars, a portion of the well region present on one side surface of each of the silicon pillars functioning as channel portion of a vertical MIS transistor;
   a second-conductivity-type diffusion layer formed on an upper surface of the well region;
   a capacitor insulating film formed on the storage node so as to surround the lower portion of each of the plurality of silicon pillars; a plate electrode buried in a lower portion of the trench to substantially the same level as an upper end of the storage node;
   a first gate insulating film of the vertical MIS transistor formed on a surface of the channel portion;
   a first gate electrode formed on the first gate insulating film so as to oppose the channel portion; and
   a collar insulating film so formed as to fill a portion of the trench above the plate electrode,
   wherein the first gate electrode is buried in the trench such that a lower end of the first gate electrode is in contact with the collar insulating film and opposing main surfaces of the first gate electrode are in contact with the first gate insulating film and the collar insulating film, and is linearly formed in a first direction along the one side surface of each of the plurality of silicon pillars in the same row.

2. The memory according to claim 1, wherein the adjacent sides satisfy 1*a*=1*b*.

3. The memory according to claim 1, wherein a thickness of that portion of the collar insulating film, which opposes the first gate insulating film, is larger than that of the gate insulating film.

4. The memory according to claim 1, further comprising:
   a second gate electrode formed on a first gate electrode so as to be electrically connected to the first gate electrode, and having a resistance lower than that of the first gate electrode;
   a cap/sidewall insulating film covering an upper surface and side surfaces of the second gate electrode;
   a dielectric interlayer which is formed over an upper surface of the substrate including the second gate electrode, and in which a bit line contact hole is formed in self-alignment with the cap/sidewall insulating film;
   a contact plug buried in the bit line contact hole in the dielectric interlayer; and
   a bit line formed on the dielectric interlayer and connected to the bit line contact plug.

5. The memory according to claim 4, further comprising a peripheral transistor formed in a peripheral region different from the cell array region on the semiconductor substrate, the peripheral transistor having a third gate electrode formed on the semiconductor substrate via a second gate insulating film, and the second and third gate electrodes being made of the same material.

6. The memory according to claim 5, wherein
   the first gate electrode is formed using polysilicon, and
   the second and third gate electrodes are formed of a metal.

7. The memory according to claim 5, wherein the second gate insulating film of the peripheral transistor includes a high-dielectric insulating material.

8. The memory according to claim 5, further comprising an element isolation region formed in the peripheral region by burying an insulator in a shallow trench having a bottom surface not lower than an upper surface of the plate electrode.

9. The memory according to claim 1, wherein the storage node is formed on the surface of each of the plurality of silicon pillars, and the well region and the silicon substrate are connected by a first-conductivity-type material inside the silicon pillar.

* * * * *